(12) United States Patent
Mukherjee et al.

(10) Patent No.: US 8,481,106 B2
(45) Date of Patent: Jul. 9, 2013

(54) HIGH-DIELECTRIC CONSTANT THIN FILM METAL OXIDES ON SILICON WAFERS FOR CAPACITOR APPLICATIONS AND METHODS OF MANUFACTURE

(75) Inventors: Shyama P. Mukherjee, Cary, NC (US); Mark L. F. Phillips, Albuquerque, NM (US); Travis P. S. Thoms, Bosque Farms, NM (US)

(73) Assignee: SBA Materials, Inc., Albuquerque, NM (US)

( * ) Notice: Subject to any disclaimer, the term of this patent is extended or adjusted under 35 U.S.C. 154(b) by 818 days.

(21) Appl. No.: 12/043,309

(22) Filed: Mar. 6, 2008

(65) Prior Publication Data

US 2008/0220153 A1 Sep. 11, 2008

Related U.S. Application Data

(60) Provisional application No. 60/893,741, filed on Mar. 8, 2007.

(51) Int. Cl.
*B05D 5/12* (2006.01)
*B05D 3/00* (2006.01)
*C23C 14/02* (2006.01)
*H01G 7/00* (2006.01)

(52) U.S. Cl.
USPC ............ 427/79; 427/80; 427/81; 427/255.12; 427/534; 427/553; 29/25.41

(58) Field of Classification Search
USPC ......... 427/79–81, 255.12, 534, 553; 29/25.35
See application file for complete search history.

(56) References Cited

U.S. PATENT DOCUMENTS

| | | | |
|---|---|---|---|
| 7,435,675 B2 * | 10/2008 | Seh et al. | 438/623 |
| 2005/0036935 A1 * | 2/2005 | Pak et al. | 423/445 R |
| 2006/0292062 A1 * | 12/2006 | Hojo et al. | 423/594.9 |
| 2007/0249744 A1 * | 10/2007 | Landskron et al. | 521/142 |
| 2008/0152577 A1 * | 6/2008 | Addiego et al. | 423/460 |

OTHER PUBLICATIONS

Pushkar Jain & Eugene J. Rymaszewski, Embedded Thin Film Capacitors—Theoretical Limits, IEEE Transactions on Advanced Packaging, Aug. 2002, pp. 454-458, vol. 25, Issue No. 3.

Rafael Van Grieken, et al., Superficial Fluid Extraction of a Nonionic Surfactant Template from SBA-15 Materials and Consequences on the Porous Structure, Langmuir, 2003, pp. 3966-3973, vol. 18.

Peidong Yang, et al., Generalized Syntheses of Large-pore Mesoporous Metal Oxides with Semicrystalline Frameworks, Nature, Nov. 12, 1998, pp. 152-155, vol. 396.

David M. Antonelli & Jackie Y. Ying, Synthesis and Characterization of Hexagonally Packed Mesoporous Tantalum Oxide Molecular Sieves, Chemistry Material, 1996, pp. 874-881, vol. 8.

* cited by examiner

*Primary Examiner* — Brian K Talbot
(74) *Attorney, Agent, or Firm* — Berliner & Associates

(57) ABSTRACT

A method of fabrication of high-k paraelectric metal oxide films at low temperatures utilizing ordered mesoporous metal oxide thin films synthesized by organic templating methodology. The process consisting of (a) chemical solution deposition of periodic ordered mesoporous structures containing high-k metal oxide films, (b) removal of organic template additives, (c) infiltration of the pores with an appropriate second phase, and (d) low temperature thermal and/or annealing of infiltrated films.

12 Claims, 10 Drawing Sheets

FIG. 2

| Materials | Thermal Exp. Coeff. 10⁶/k | Band gap Eg(ev) | Ref. index | Dilectric Constant | (Freq. Range, Hz) | Electrical Characteristic | Film Thickness um | Capacitance Density (nF/cm2) |
|---|---|---|---|---|---|---|---|---|
| Al2O3 | 6.5-8.8 | 8.6-8.8 | 1.6-1.7 | 9.0-10.0 | $10^2 - 10^{11}$ | paraelectric | 0.15 | 50 |
| SiO2 | 0.5-0.6 | 8.9-9.3 | 1.475 | 3.8-3.9 | $10^5 - 10^{11}$ | paraelectric | 0.024 | 140 |
| TiO2 | 7.1-9.2 | 3.1-3.5 | 2.3-2.7 | 89-173 | $10^2 - 10^8$ | paraelectric | | |
| Ta2O5(amorp) | 2.5-4.0 | 4.0-4.5 | 2.0-2.2 | 22-26 | $10 - 10^6$ | paraelectric | 0.16 | 130 |
| Ta2O5(cryst) | | 4.0-4.5 | 2.0-2.2 | 50 | | paraelectric | | |
| HfO2 | 5.6-5.9 | 5.5-5.9 | 2.0-2.2 | 21-25 | $10^4 - 10^6$ | paraelectric | | |
| ZrO2 | 7.0-8.0 | 5.4-5.8 | 2.1-2.2 | 14-18 | $10^2 - 10^{11}$ | paraelectric | | |
| Y2O3 | 7.9-9.3 | 5.5-6.0 | 1.7-1.9 | 14-18 | $10^3 - 10^7$ | paraelectric | | |
| La2O3 | 5.8-6.6 | 4.0-5.4 | 2.0-2.1 | 21-27 | $10^4 - 10^6$ | paraelectric | | |
| (Ba Sr)TiO3 | ~11 | | | ~1000 | | ferroelectric | 0.25 | 2000 |
| Lead Zirconate Titanate PbZrxTi1-xO3 | ~12 | | | 2000 | | ferroelectric | 0.5 | 2000 |
| ZrSiO4 | 4.0-5.0 | 6.0-7.6 | 1.9-2.0 | 12.00 | | paraelectric | | |
| BaZrO3 | 6.3-8.7 | 5.3 | 2 | 28-43 | | paraelectric | | |
| BaTiO3 | ~12 | | | 2000-3000 | | ferroelectric | | |

HIGH-DIELECTRIC CONSTANT THIN FILM METAL OXIDES ON SILICON WAFERS FOR CAPACITOR APPLICATIONS AND METHODS OF MANUFACTURE

CROSS-REFERENCE TO PENDING APPLICATIONS

This application claims the benefit of Provisional Patent Application No. 60/893,741 filed Mar. 8, 2007.

TECHNICAL FIELD

The present invention comprises fabrication of novel high-k thin film embedded capacitors on silicon wafers utilizing mesoporous ordered high-k metal oxide films produced via chemical solution deposition of metal oxide precursors containing block co-polymers as templates.

TECHNICAL FIELD

The present invention comprises fabrication of novel high-k thin film embedded capacitors on silicon wafers utilizing mesoporous ordered high-k metal oxide films produced via chemical solution deposition of metal oxide precursors containing block co-polymers as templates.

BACKGROUND AND SUMMARY OF THE INVENTION

Currently the miniaturization in consumer electronic products, particularly wireless communications devices, demands highly integrated ultra-thin packages with embedded passives such as resistors, capacitors, and inductors. Hence, integration of capacitors in thin film form (embedded within the substrate) is required to achieve novel compact packaging modules with high packaging density, high performance, and reliability at low cost. Wide ranges of capacitors are needed (from a few pF to the uF range) for a variety of functions such as decoupling, switching noise suppression, impedance matching, by-pass filtering, tuning, feed back, and termination in electronic circuitry.

Substrates for Embedded Capacitor Applications:

At present three types of substrates are being utilized in the development of thin film embedded capacitors:

Type 1. Metal Foils. Fabrication of thin film embedded capacitors on printed circuit boards via dielectric coating on metal foils such as nickel or copper.

Type 2. Ceramic Substrates: Fabrication of embedded capacitors on ceramic substrates such as multilayer ceramic substrates (LTCC) or individual ceramic substrates that can be used as interposers.

Type 3. Silicon Wafers: Fabrication of thin film metal oxide capacitors on silicon wafers. The metal foils and ceramic substrates have high surface roughness and thus are not suitable for depositing/fabricating reliable thin film capacitors.

The present invention utilizes silicon wafers as substrates. The rationale for the selection of silicon wafers as substrates is as follows:

Surface roughness/surface irregularities of substrates play major roles on the leakage current density and breakdown field strength of capacitors as well as yields of thin film capacitors. The leakage current density and breakdown field strength of the capacitors are qualitatively correlated to the amount and degree of surface irregularities on the substrates. Large local electric fields result from surface irregularities and cause the capacitors to have higher leakage current densities and fail at lower applied bias voltage. Since these electrical requirements are very important for the reliability of embedded capacitors, and since the use of submicron thickness of high dielectric constant paraelectric/ferroelectric metal oxides is required to achieve desirable capacitance density, silicon wafers are desirable substrates.

Thus, high capacitance densities can be achieved with submicron thickness of high-k metal oxides.

Direct patterning of dielectric layers to define capacitance density is highly desirable and the use of silicon wafers as substrates offers the opportunity to develop direct patterning capability.

Considering the advent of wafer level packaging (WLP), which is a true chip scale packaging (CSP), our focus is to develop thin film capacitors on silicon wafers. Moreover, it is compatible with the application of SBA materials in microelectronic technology. Some of the key knowledge practiced in low-k fabrication using SBA Materials can advantageously be used in the capacitor fabrication technology. Moreover, silicon wafer-based manufacturing is well developed and applicable to thin film metal oxide processing.

However, critical challenges associated with the silicon wafer as substrate are (a) high tensile stress due to thermal expansion mismatch between silicon and high-k films. However, since the thickness of the films on silicon is the submicron range, the tensile stress due to thermal mismatch can be tolerated with strong adhesion which is usually obtained with chemical solution derived films. (b) Limitation in thermal annealing at high temperatures due to interfacial reactions between (i) silicon and conducting metal films, and (ii) conducting metal such as Pt and the dielectric layer.

Deposition Methods for Fabricating High-k Metal Oxide Thin Film Capacitors

The following types of deposition methods are the principle approaches being investigated for the development of thin film embedded capacitors:

(a) Sputtering Technique:

Sputtering is a well-established technique in semiconductor industry and is easily adaptable to device fabrication. The technique is advantageous in making single component dense metal oxide such as tantalum oxide and hafnium oxide films using the r.f magnetron sputtering technique, however, the deposition of multi-component metal oxides such as barium titanate and barium-strontium titanate (ferroelectrics), with controlled compositions of minor additives, faces technical challenges because the fabrication of sputter targets with a precise composition having small amounts of additives is extremely difficult and very expensive.

Moreover, the deposition of sputtered films having same compositions as those of the targets is uncertain and not reproducible.

(b) Chemical Vapor Deposition Techniques:

A variety of chemical vapor deposition techniques have been used in the deposition of dielectric films in semiconductor fabrication processes for making high-k gate oxides. Some of them are as follows:

Metal Organic Chemical Vapor Deposition (MOCVD)

Atomic Layer Deposition (ALD)

It should be noted that these techniques are complicated process and need very expensive equipment. They are being developed to satisfy very rigorous requirements of high-k gate oxides for semiconductor fabrication, but are slow and expensive for packaging technology, which demands low cost and less capital investment.

(c) Chemical Solution Deposition (CSD) Method/Sol-Gel Method:

The CSD/Sol-Gel Method offers technical and cost advantages over the sputtering method but is limited by inherent technical limitations when processing on silicon wafers. Some of the disadvantages are as follows:

i. Random void/nanoporosity development during thermal annealing and thus the densification is incomplete when silicon wafers are used as substrates because of thermal budget limitations. Wide distribution of pore sizes and random distribution of pores causes a non-uniform distribution of both drying stress and annealing stress. Consequently, cracking is a serious problem.

ii. Cracking is a serious problem with CSD/Sol-Gel deposition because of non-uniform drying stress (capillary pressure during drying of solvents) develops in films having non-uniform pore structures. Consequently, a large number spin coatings i.e. multiple layers are to be deposited sequentially to achieve the desired film.

iii. Cracking is more pronounced with silicon wafers because of the thermal expansion mismatch between silicon and CSD metal-oxide films.

d) Photochemical Metal Organic Deposition (PMOD) of Thin Films (Mukherjee et al. "High Dielectric Constant Metal Oxide Films via Photochemical Metal Organic Deposition (PMOD) Process" in Physics and Technology of High-k Gate Dielectrics I, Proc. Of International Symposium on High Dielectric Constant Materials: Materials science, Processing reliability and manufacturing Issues" Edited by S. Kar et al, ECS conf Proc. Vol 2002-28)

This method is based on the photoconversion of high-k metal organic precursor solutions that are spin coated on wafers. This method has the advantage of conversion of metal organic precursors to amorphous metal oxides at low temperatures by UV radiation to single or mixed oxide metal oxide films. This process has an added advantage of photopatterning of the dielectric films using conventional UV lithographic exposure. However, this also has the usual limitations that are typical of the conventional sol-gel/CSD method.

BRIEF DESCRIPTION OF THE DRAWINGS

A more complete understanding of the invention may be had by reference to the following Detailed Description taken in conjunction with the accompanied drawings;

FIG. 2 is a chart illustrating material constants and dielectric properties of representative high-k metal oxides;

DETAILED DESCRIPTION

Figure 1:
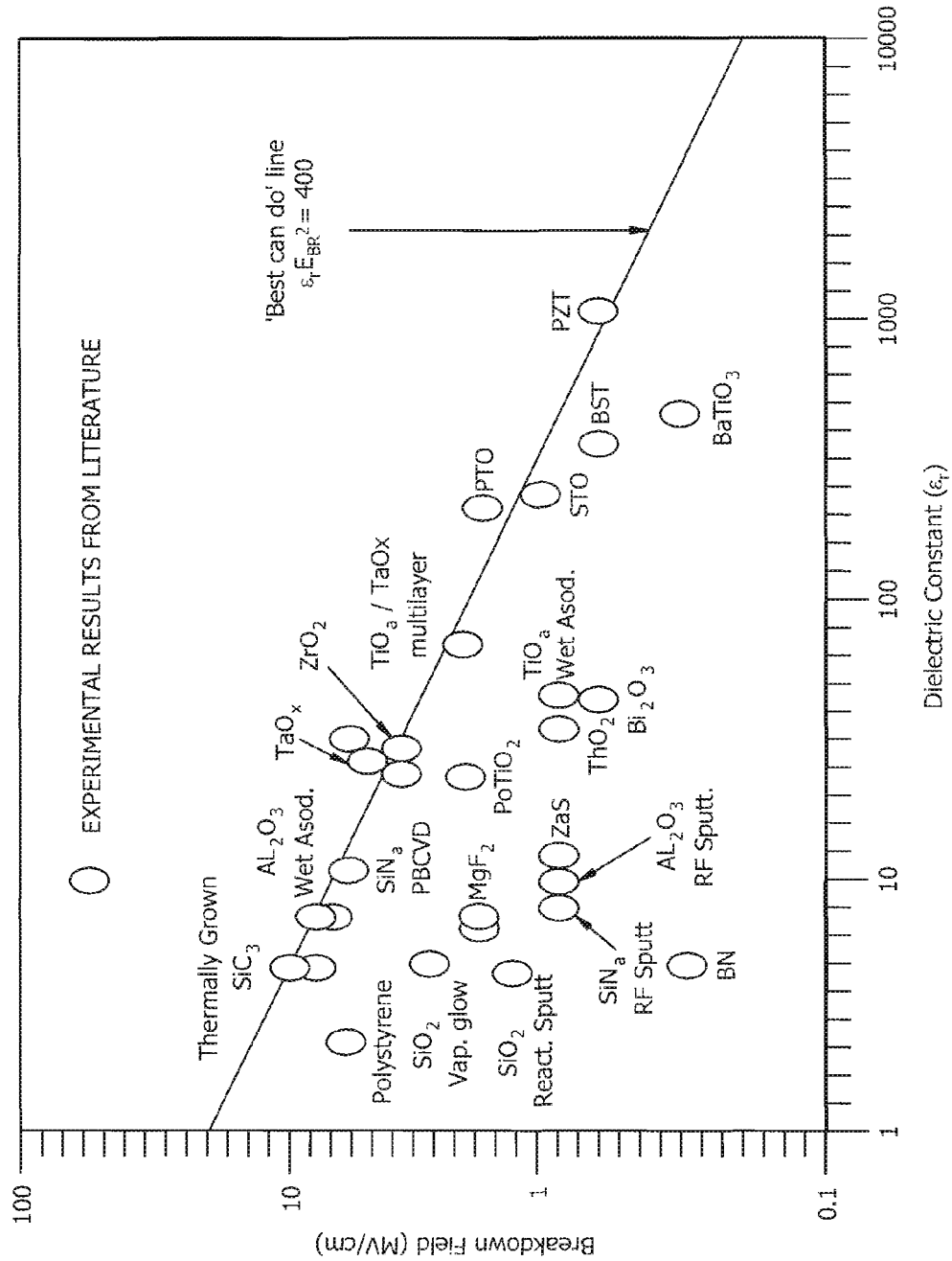
FIG. 1 is a chart illustrating breakdown field as a function of dielectric constant.
Figure 3:
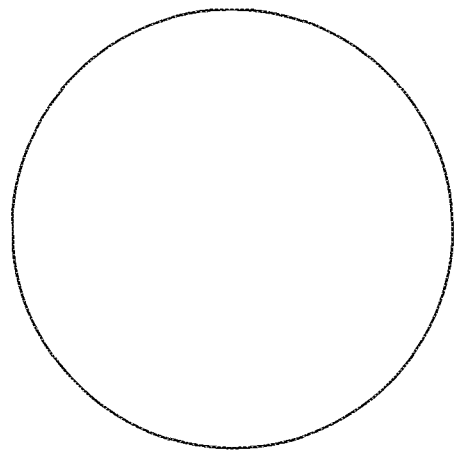
FIG. 3 is top view of a wafer upon which dielectric precursor sol-gel will be deposited.
Figure 4:
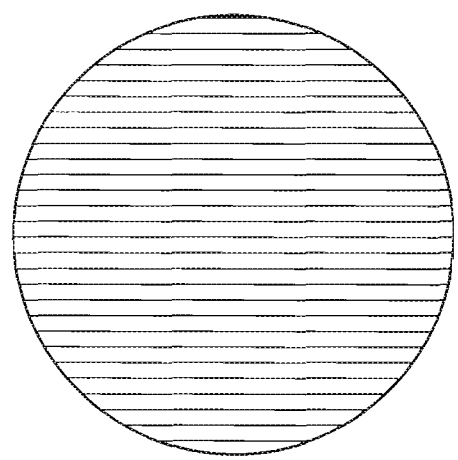
FIG. 4 is a top view of the wafer of FIG. 3 upon which dielectric precursor sol-gel has been deposited.
Figure 5:
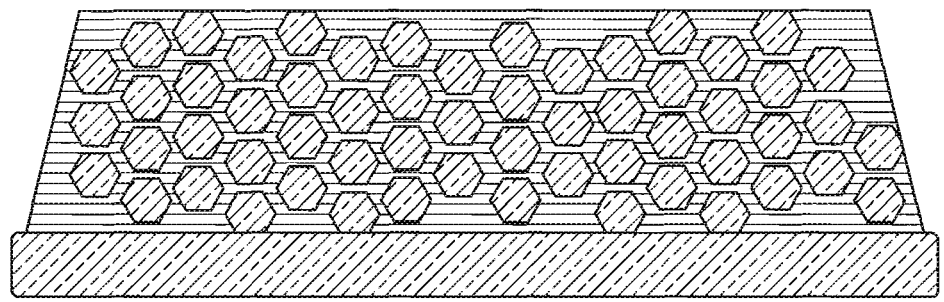
FIG. 5 is a sectional view illustrating dielectric film deposited on a wafer and incipient pores formed therein.
Figure 6:
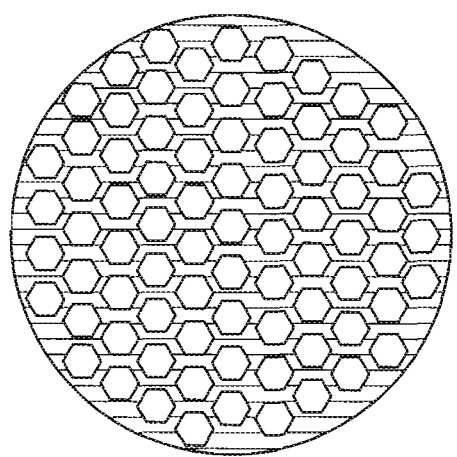
FIG. 6 is a top view dielectric film following template removal to form ordered porosity.
Figure 7:
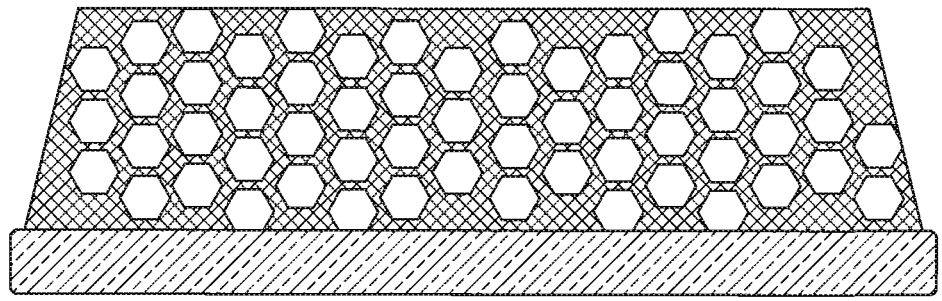
FIG. 7 is a sectional view similar to FIG. 6.
Figure 8:
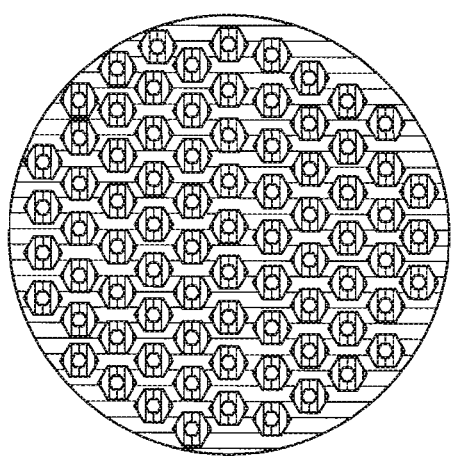
FIG. 8 is a top view of porous dielectric film illustrating infiltration of a high-k precursor solution.
Figure 9:
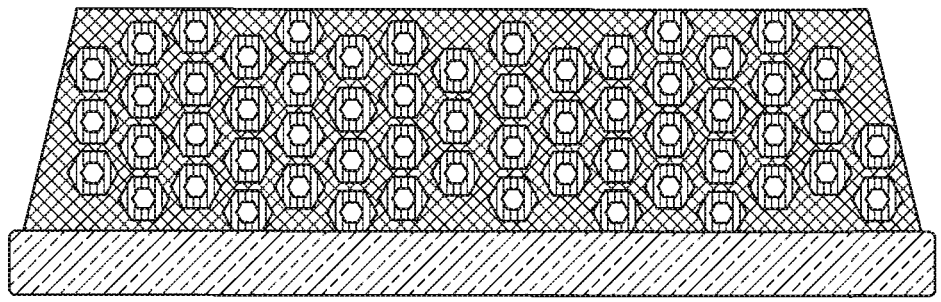
FIG. 9 is sectional view similar to FIG. 8.
Figure 10:
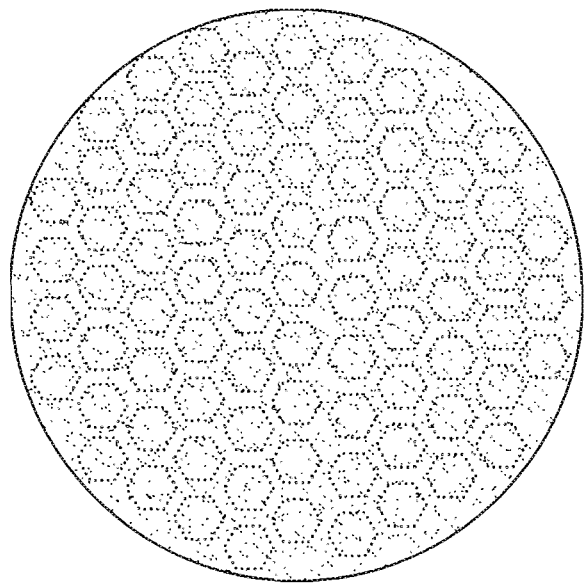
FIG. 10 is a top view illustrating cured/annealed high K dielectric material on a wafer.
Figure 11:
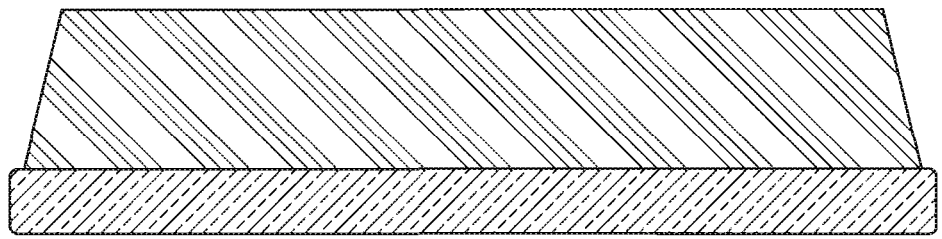
FIG. 11 is a sectional view similar to FIG. 10.
Figure 12:
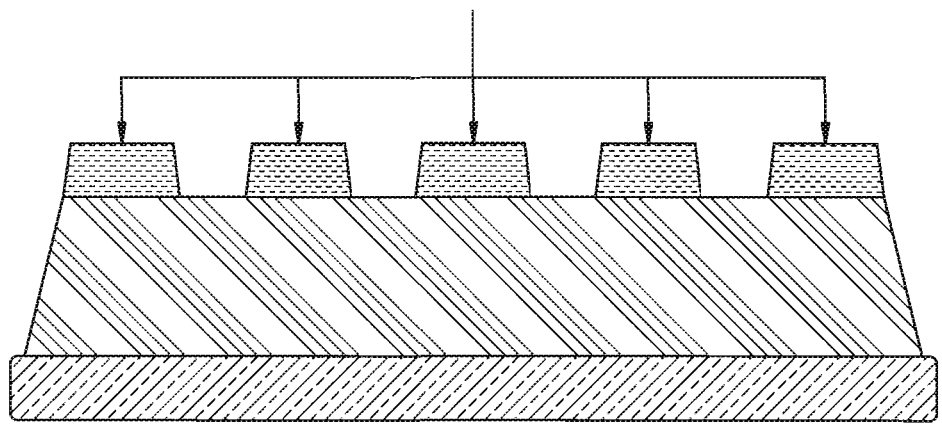
FIG. 12 is a sectional view illustrating high-k dielectric material with a patterning mask applied thereto.
Figure 13:
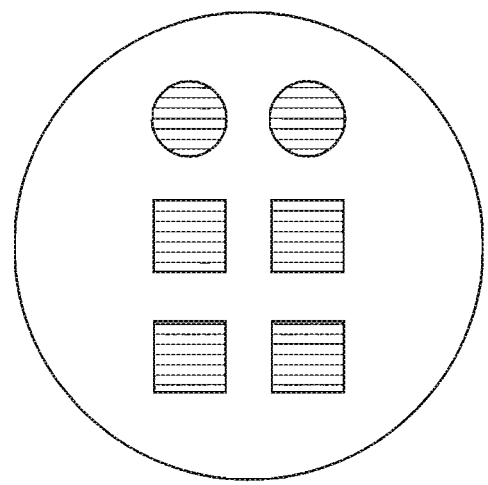
FIG. 13 is a sectional view of dielectric material patterned to form individual capacitors.
Figure 14:
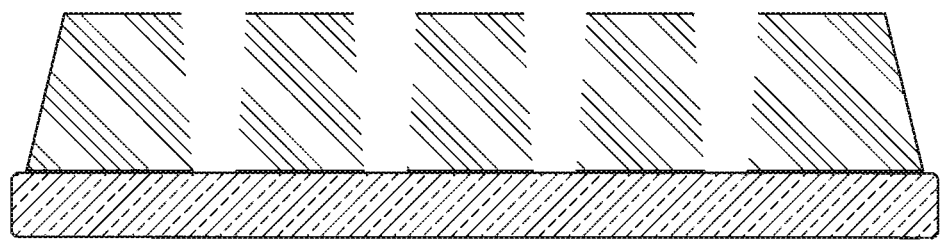
FIG. 14 is a sectional view illustrating patterned high-k dielectrical material.
Figure 15:
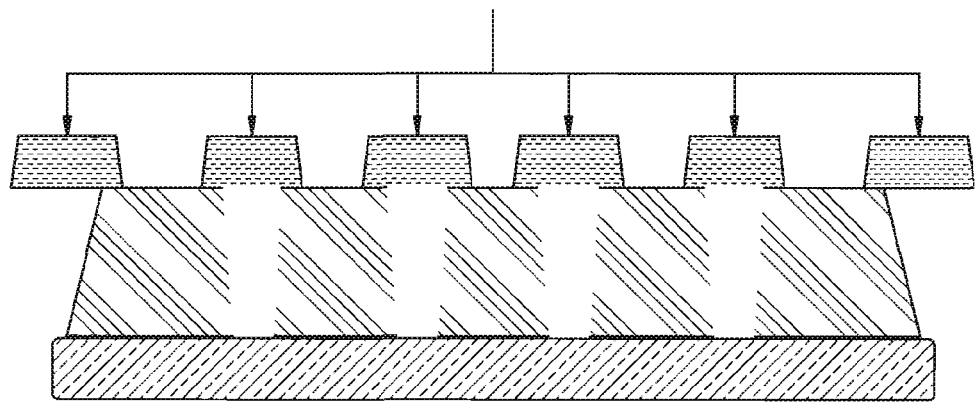
FIG. 15 is an illustration of a mask applied to patterned high k dielectrical material to form electrodes.
Figure 16:
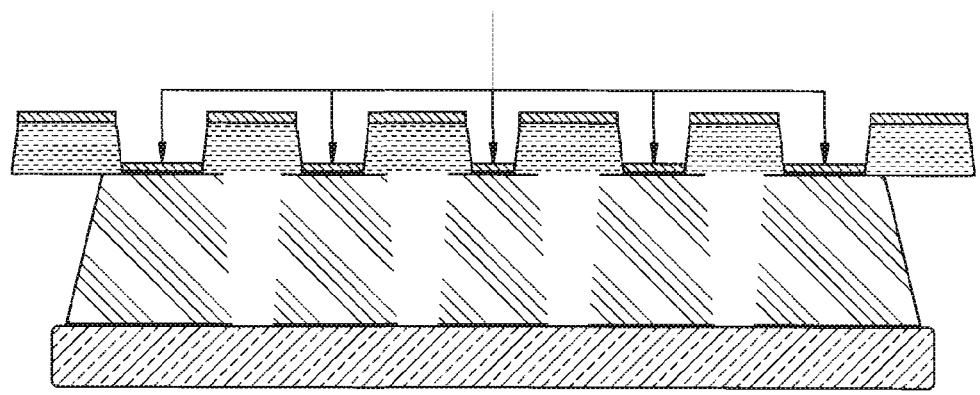
FIG. 16 is a view similar to FIG. 15 illustrating electrode material deposited both on the dielectric material and on the mask.
Figure 17:
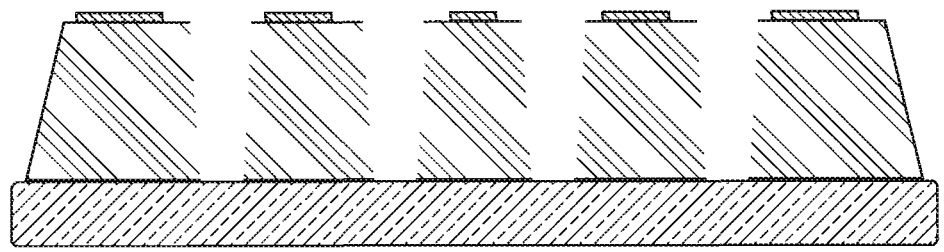
FIG. 17 is a sectional view illustrating completed capacitors formed on wafers.
Figure 18:
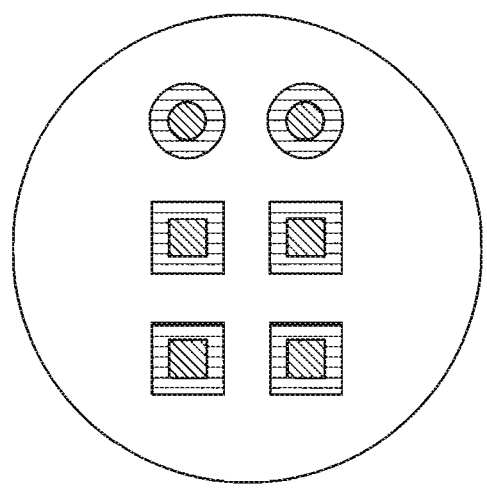
FIG. 18 is a top view of wafers having completed capacitors form thereon.

The present invention comprises a process for fabrication of high-K paraelectric metal oxide films at low temperatures utilizing ordered mesoporous metal oxide thin films synthesized by organic templating methodology. The process consists of (a) chemical solution deposition of periodic ordered mesoporous structures containing high-k metal oxide films, (b) removal of organic template additives using techniques such as thermal baking, supercritical fluid extraction, and/or ultraviolet radiation, (c) infiltration of the pores with an appropriate second phase which acts as a densification aid and as an additive to improve electrical performance of final dense films, and (d) low temperature thermal and/or UV annealing of infiltrated films. After removal of organics at low temperatures the metal oxides are in an amorphous state or in nanocrystalline state. It is well established that the amorphous/nanocrystalline nature of the high-k metal oxides is desirable because the amorphous nature of the films improves the insulation resistance and lowers the leakage current. Moreover, a small concentration of appropriate additives/dopants is incorporated to the metal oxide via infiltration so that the amorphous nature/nanocrystallinity is maintained during the annealing/densification. One of the infiltrating phases is a glass former such as silica or Germania or an organometallic precursor for metal nitride formation. Small concentrations of acceptor dopants dramatically modify the properties of ferroelectric materials such as BST. A significant reduction of the loss tangent and enhanced film resistivity are obtained by incorporating appropriate acceptor dopants such as $Co+2$, $Co+3$ $Mn+2$ $Mn+3$ $Ni+2$ $Mg+2$ $Al+3$, $Ga+3$, etc. which occupy the B sites of the $(A2+B4+02-)$ perovskite structure. When a ferroelectric phase such as Barium strontium titanate is used as matrices, the infiltrating composition contains dopants. The distribution and sizes of the pores is very uniform in mesoporous films of high-k metal oxides The pore sizes are in <10 nm scale. The microstructure is extremely conducive to the homogeneous distribution of the infiltrated second phase. The concentration of additive infiltration is controlled by the chemical nature of the infiltrating/absorbing solution (surface tension and nature of solvent) and time of soaking. A small concentration of liquid phase is needed for densification/pore collapsing and for improving electrical performance.

The following processes are adopted for making the mesoporous high-k metal oxide films:

(a) A film consisting of a mesoporous binder phase is synthesized in the presence of an organic template, which is then removed. A liquid precursor material for a high-k phase such as $BaTi03$ is then diffused into the film, where it is crystallized or otherwise hardened. The binder phase is optionally densified around the high-k phase by thermal anneal, UV exposure, or other techniques. This yields an opal-like structure.

(b) The synthesis of nanoparticles of high-k metal oxides which may be single or bi-metallic metal oxides and subsequently functionalizing them with organic compounds and adding appropriate templates for making mesoporous films, then adding these nanostructured oxides to a liquid precursor to a binder phase, then condensing the liquid into a solid film, which is then annealed to yield an opal-like structure.

(c) Synthesizing a chemically inhomogeneous microstructure comprising a mesoporous film having a nano-scale homogeneous dispersion of a binder-forming component such as silica or germania as a minor phase in a matrix of ordered mesoporous high-k metal oxides which is the major phase. During thermal annealing the binder-forming constituent melts and acts as a sintering aid in densification of the high-k metal oxide mesoporous phase, which produces a film with an inverse opal structure.

It should be noted that the synthesis procedures of mesoporous ordered high-k metal oxides as described in Approach I and Approach II are not novel and have been reported in the literature. However, the presence of porosity in high-k metal oxides lowers the dielectric constant and is not desirable for achieving reliable electrical performances. Moreover, a small concentration of other metal oxides or nitride additives, as dopants, is needed for the densification, and for improving the electrical performance of the films. The objective of the infiltration of a second phase is to fulfill that requirement.

It is important to note that though nanoporous high-k metal oxide films as synthesized are not desirable for use as high capacitance density thin film capacitor applications, the present invention takes advantage of the special characteristics of ordered mesoporous metal oxide structures and modifies them chemically and structurally by infiltration/impregnation with chemical solutions of appropriate compositions. Thus, the final modified films acquire desirable electrical performance characteristics.

The novelty and importance of the present invention comprises of the following technical aspects:

(a) Selection of appropriate metal oxide precursors and templating organic additives that can produce ordered mesoporous high k metal oxide films with desirable pore structure and pore volume.

(b) Synthesis of bi-metallic titanates, such as barium titanate or barium strontium titanate, etc., containing organic templates that lead to the generation of mesoporous films of mixed oxides that can be infiltrated/impregnated with appropriate metal oxide precursor solutions for improving the electrical performance and densification.

(c) Removal of organic template compounds at low temperatures by a combination of the following techniques: (1) Thermal, (2) UV Radiation, (3) Supercritical Fluid Extraction, (4) Ashing with a reactive plasma, e.g., 02, (5) treatment with UV-03, (6) and/or e-beam curing.

(d) Infiltration/Impregnation of a metal salt/metal organic precursor chemical solution(s) of appropriate composition which structurally modifies and improves the electrical performance of mesoporous films by densification and by changing the composition during subsequent annealing of the impregnated film is performed.

Nature and Functions of Infiltrating phases:

Incorporation of a second phase as an additive (via infiltration) after the removal of organics which can offer different functions; some of them are as follows:

(a) A second phase which enhances densification on rapid thermal annealing. Infiltration or impregnation of the pores with a second fluid phase having a metal organic precursor or sol-gel precursor of metal oxides, which sinters or densities at low temperatures, leading to the densification of the primary high-k porous film.

(b) A second phase which improves the electrical performance of the films. They are additives such as Al2O3, SiO2, Zno, alone or in combination with TiO2, ZrO2, TaO5, HfO2, etc., nitrogen as nitrides for paraelectric metal oxides, and metal oxide dopants such as acceptors or donors for ferroelectric perovskite films. By keeping the composition of the infiltrating phase fixed the infiltrated amount of the second phase and the extent of densification of the final film will predict the dielectric constant of the final film.

Advantages resulting from the use of ordered periodic porosity are (i) the pore volume can be tailored and controlled by the templating methodology, (ii) uniform ordered mesoporous film will have a high modulus that will withstand the drying stress, and thus the degree of cracking will be significantly less, particularly when a thick single layer is deposited.

The final composition of the film having the infiltrating phase and the final thickness of the film after densification dictate the dielectric constant and capacitance density.

In addition to assisting in densification, the infiltrating phase as a binder forming phase which inhibits the crystal growth of the high-k paraelectric metal oxide film during high temperature annealing. The maintenance of the amorphous/nanocrystalline nature of high-k metal oxides and inhibition of crystal growth are important requirements for the electrical performance of paraelectric metal oxide thin film (submicron) capacitors.

(d) Infiltration of metal oxide precursors that are photoactive so that the conversion of the deposited phase to metal oxide occurs at low temperature (e) Infiltration of metal halide binder precursors which form a transient halide binder liquid phase and acts as a sintering aids (f) Infiltration of an organic polymeric dielectric solution such as polyimide or which cures at low temperatures or by UV radiation (g) Develop a low thermal budget/low temperature process(s) for the fabrication of thin film capacitors by combining the selection of the chemistry of the infiltrating phases (such as low melting inorganic metal oxides and the annealing techniques such as Rapid Thermal Annealing (RTA), and Rapid Thermal Annealing assisted with UV radiation.

Some of the advantages and technical issues associated with the present invention are:

a) Cracking during drying is reduced significantly because the drying stress of ordered mesoporous films is less than that of films of the same thickness deposited by conventional chemical solution/sol-gel deposition processes. Thus, crack-free films of higher thickness can be obtained by spin or dip coating when the present invention is compared with conventional techniques. This is an important feature for manufacturing.

b) The volume fraction and pore sizes of the mesoporous high-k films can be tailored by appropriate choice of both metal oxide precursor chemistry and the chemistry of the templating compounds.

c) The densification and final composition of the film can be tailored by the appropriate selection of the composition of the impregnating solution(s). Thus, the electrical performance and the reliability of the capacitor can be tailored and improved.

d) The annealing or densification of the impregnated porous films can achieved at low temperatures by:
  1. Appropriate selection(s) of the chemistries of the infiltrating/impregnating solutions, and
  2. Applying appropriate annealing techniques.

e) Spin-coating, which is a well-established technique for wafer coating, can be utilized.

f) Dip-coating of large area substrates can also be achieved.

g) The process is both low in cost and flexible.

Selection of High-k Metal Oxides and Target Thickness

Ref. P. Jain and E. J. Rymaszewski, Embedded Thin Film Capacitors-Theoretical Limits, IEEE Transactions on Advanced Packaging vol 25, No 3 August 2002 p 454)

Electrical breakdown field and dielectric constant of thin films are the two basic properties which govern the electrical performance of thin film capacitors. The thin films having both high dielectric constant and high breakdown field would be the best choice as embedded capacitors in signal and power electronics. But the literature data show that an inherent trade-off between breakdown field and dielectric constant of thin films. Usually, an empirical relationship, $E_{BR}(MV/cm)=20/k^{1/2}$ is an excellent basis for determining upper limits of an embedded thin film capacitor design space. The relationship is presented in FIG. 1. Maximum breakdown voltage $V_{BR}$ and capacitance density, $_{C/A}$(=Capacitance and A=Capacitor area) are the two main figures of merit for any thin film dielectric material to be used in any capacitor applications. Using the empirical correlation for breakdown field and basic fundamental capacitance density, the following relationships are derived:

$$V_{BR}=1.7k^{0.5}/(C/A)$$

$$V_{BR}=60d^{0.5}/(C/A)^{0.5}$$

Where $V_{BR}$ in volts, (C/A) in uF/cm² and d is um.

Based on this relationship, one can make a general conclusion that thicker films are required in order to achieve the same breakdown voltage of films, if the materials with high dielectric constant are used. However, there are other additional factors related to the structural aspects such as nature of crystallinity and composition (additives and dopants) of each type of dielectric film which also influence the electrical performances.

Different types of dielectric films can be produced by means of the invention.

Type I: Low dielectric constant metal oxides or paraelectric metal oxides (such as $Ta_2O_5$, $Nb_2O_5$, $TiO_2$, $ZrO_2$, etc.). These metal oxides have low dielectric constant (see FIG. 2) range and thus produce thin films of low capacitance densities. Low dielectric metal oxides and paraelectric metal oxides provide critical advantages in electrical performance (see Table on Dielectric properties of paraelectric metal oxides, FIG. 2). The dielectric behavior of the thin films of paraelectric metal oxides is less dependent on the processing conditions, temperatures and grain morphology and frequency. They are more suitable for high tolerance applications such as filtering, RF/wireless. Also, these oxides can be doped with other silicon oxides or nitrogen for improved electrical performance.

Type II: Ferroelectric Dielectrics, ABO3, perovskite structures.

High dielectric constant inorganic metal titanates (such as Barium Titanate or Strontium Titanate or Barium Strontium Titanate) produce thin films of high capacitance densities) (see FIG. 2).

However, the dielectric properties of thin films are a strong function of minor constituents and compositions (particularly acceptor and donors) temperature, frequency, film thickness and morphology/grain sizes. The perovskite structure based films are suitable for decoupling capacitors because of their high capacitance densities.

Bottom Electrodes for Capacitor Fabrication:

Si/adhesion layer Ti/Pt: Sputtered. This is a well-established material, but has some disadvantages in terms of interfacial reactions and cost.

Metal Oxide Electronic Conductors via CSD Processes: Electronic conductor metal oxide thin films of $RuO_2$, $SrRuO_3$, $IrO_2$ and $LaNiO_3$ are used as bottom electrodes for high-k metal oxides dielectrics. They are beneficial for adhesion and improve the electrical performance particularly electrical fatigue.

Summary of Available Processing Steps and Key Issues Elated to Processing:

A. Synthesis of Coating Solutions and Composition of Coating Solutions:

Types of Templating Chemistries/Materials:
(a) Surfactant type chemistries
(b) Amphiphilic poly(alkene oxide) block copolymers Types of Metal Oxide Precursors:
(a) Metal organic compounds
(b) Inorganic Metal Salts B. Deposition Methods
(a) Spin-coating
(b) Dip-coating C. Baking Mild baking at low temperature is employed to generate a sufficient modulus so that the integrity of films can be maintained during the organic removal process. The baking step continues only to the point that minimum crystallinity and minimum network formation are developed. The structural state of the metal oxide skeleton is such that the porous structures after organic removal can collapse/densify on thermal annealing in presence of the infiltrated phase, and either the amorphous or nanocrystalline state is maintained after annealing.

D. Removal of Organic Phase:
1) Calcination
2) Extraction with solvents or acids
3) Supercritical Fluid Extraction
4) Short wavelength (193 nm to 254 nm) UV radiation The supercritical fluid extraction and short wavelength UV radiation in the presence of oxygen are preferred because of their capability for efficient removal of organics at low temperatures.

The removal of the organics from the pore walls and maintaining the interconnectivity of pores are believed to be more effective by supercritical fluid extraction. The clean wall surface and interconnectivity of pores improves the infiltration efficiency of sol gel precursors. Moreover, since the organic removal is achieved at low temperature using supercritical fluid extraction, crystal growth and the degree of network formation are less. Thus, the densification is more effective at lower temperatures with shorter time.

Short wave length (193 nm to 254 nm) UV radiation, such as excimer laser radiation in presence of oxygen, is very effective in removing organics from sol-gel derived ceramic oxide thin films at low temperatures and has successfully transformed sol-gel derived amorphous ferroelectric films to crystalline ferroelectric films at temperatures much lower than that needed by thermal annealing.

E. Infiltration or Impregnation of Second Fluid Phase:

The nanoporous structures thus created are infiltrated with metal salts/metal organic precursor solutions or a sol-gel metal oxide precursor solution having low viscosities and high wetting ability within the metal oxide porous film.

Initial experimental works, using the infiltration of colored dye solution into tantalum oxide mesoporous films, indicate that the infiltration is a feasible process.

F. Compositions of Infiltrating Phases:

(Please see the previous section which describes the nature of infiltrating phases)

G. The composition of the infiltrating solution is selected such that the film will densify via liquid phase or glassy phase formation. The following types of sintering additives prepared via sol-gel methods are preferred:
1) Low melting glasses in $P_2O_5$—$SiO_2$ system;
2) Low melting glasses in ZnO—$B_2O_3$, ZnO—$SiO_2$, $Bi_2O_3$—$SiO_2$
3) A replacement of $SiO_2$ with $GeO_2$ can further lower the densification temperatures;
4) Sol gel fluoride glass precursors such as Zr-fluoride, Aluminum fluoride, and/or Zinc fluoride which form a transient liquid phase and enhance densification but subsequently transform into high-k metal oxides or oxifluorides on annealing.
5) Metal oxide precursors that act as a dopant (acceptor/donors) when the major phase is a ferroelectric metal oxide, such as barium titanate, strontium titanate or (Barium-Strontium Titanate).
6) Photoactive Metal organic precursors
7) Organic Dielectric phases such as polyimides G. Rapid Thermal Annealing for Densification:

Rapid Thermal Annealing (RTA) at temperatures in the range 700° to 900° C. for <10 minutes is effective in densification of the films.

H. Rapid Thermal Annealing Under Short Wavelength UV and Oxygen:

EXAMPLE I

Step 1

This step is based on the synthesis of barium titanate itself or a barium titanate precursor such as barium titanate glycolate that is mixed with a block copolymer or other organic templates to make a coating solution that, after deposition, will convert to mesoporous films on subsequent appropriate treatments.

Preparation of Barium Titanate Glycolate:

5.9 g Barium oxide is placed in a glass beaker, to which 30.0 ml ethylene glycol is added and stirred for an hour. To this, 50 ml of 2 propanol is added and the entire mixture is filtered via vacuum filtration to remove undesired solids. 9.0 g of titanium isopropoxide is added to the recovered liquid, causing the formation of an off-white precipitate. The new mixture is allowed to stir at room temperature for 30 min. The desired solid is then filtered from the mixture via vacuum filtration, washed three times with isopropanol and dried under vacuum.

Step 2

Preparation of Coating Solution Using Barium Titanate Precursors

This step is based on the preparation of mixed precursors of individual oxides with block copolymers as a template.

3.0 g 2-methoxyethanol, 0.55 g titanium isopropoxide, 2.5 g 20% barium isopropoxide in isopropanol, 2.0 g ethanol, 0.2 g Pluronic P123, and 0.15 g acetylacetone were stirred to dissolution. Another solution of 0.10 g ethanol and 0.08 g 1.0 F acetic acid was added to the first solution. The final solution was filtered and spin coated at 3000 rpm for 30 seconds on silicon and platinum-coated silicon wafers. These samples were baked at 130 C for 1 h, followed by 350 C for 20 minutes. The annealing for densification/sintering was done at 900 C for 2 minutes. The film thickness after sintering was 82 nm.

EXAMPLE II

Preparation of Tantalum Oxide Dielectric Thin Films Via Mesoporous Tantalum Oxides Synthesis of Mesoporous Tantalum Oxide Solution:
0.18 g acetylacetone, 1.0 g Tantalum ethoxide and 1.33 g 2-propanol were combined and allowed to stir overnight at room temperature. This solution was added to a solution of 0.42 Pluronic P123, 4.66 g 2-propanol and 0.06 g water. Mixture is stirred at room temperature for 1.5 hours, then filtered via 0.2 um PTFE syringe filter.

Deposition of Films:
The tantalum oxide precursor solution thus synthesized is spin-coated onto Si and Pt-coated Si wafers with a spin speed of 4000 rpm for 30 seconds. The samples were baked at 130 C for 1 hour followed by a thermal bake at 350 C for 3 hours. Alternatively the TA05 film can be plasma ashed in 02 after the 350 c bake, which improves the removal of the organic template.

Infiltration:
The post-baked samples (silicon wafers coated with baked tantalum oxide and platinum-coated silicon wafers with tantalum oxide films) were immersed in a solution of 0.35 tetraethyl orthosilicate, 0.1N nitric acid and 21.5 g ethanol and left to soak over night. After the soak, the samples were quickly dip-rinsed with ethanol and baked at 130 C for one hour.

Densification/Sintering:
The films after infiltration were annealed at 900 C for 2 minutes.

Thickness:
Thickness of the film on silicon was ~111 nm

Dielectric constants:
The k-values obtained by this method varies as a function of processing conditions and thickness and they are in the range 15 to 24 with tantalum oxide films with silica infiltration. The value obtained with the example mentioned above is ~15.

EXAMPLE III

Titanium Oxide-Tantalum Oxide Films with SiO2 Infiltration (Inverse Opal)

0.537 g acetylacetone, 1.09 g Tantalum ethoxide, 0.13 g Ti (acac)2 (OiPr)2, and 5.0 g 2-propanol were combined and allowed to stir overnight at room temperature. To this solution was added 0.1 g Pluronic P123, 4.66 g 2-propanol, and 0.06 g water. Mixture is stirred at room temperature for 1.5 hrs, filtered via 0.2 um PFTE syringe filter, and spun onto silicon and platinum-coated silicon wafer substrates (4000 RPM/30 s).

These samples were baked at 150 C for 20 min in N2, bubbled through conc. NH3 solution, followed by a 350 C bake for 3 hrs in air.

Following the bake, samples with silicon and platinum-coated silicon substrates were immersed in a solution of 0.35 g tetraethyl orthosilicate, 0.5 g 0.1 N nitric acid, and 21.5 g ethanol and left to soak overnight.

After the soak, samples were quickly dip-rinsed with ethanol, and baked at 130 C for an hour. A final firing at 900 C for 2 minutes was then performed. Thickness: 100 nm, n633; 1.612, k at V=0:15.1

EXAMPLE IV

Titanium Oxide-Tantalum Oxide Films (Inverse Opal)

To 5.0 g of 2-propanol, 0.537 g acetoacetone, 1.1 g tantalum ethoxide, 0.13 g Ti (acac)2 (OiPr)2 and 0.039 g of tetramethylorthosilane was added. Solution was stirred at room temperature overnight.

EXAMPLE V

Films consisting of BaTiO3 ferroelectric nanoparticles dispersed in borophosphosilicate (BPS) glass: (opal) 0.143 g B2O3 and 0.164 g P2O5 was dissolved in 8 ml ethanol. 1.5 g of propylene oxide was added and mixture was heated at 60 C for 20 min, then allowed to sit at room temperature for 1 h. 1.93 g of tetraethylorthosilane was added and mixture was again heated to 60 C for an additional 40 min, after which 0.5 g of 0.01 N HNO3 was included, and entire mixture was stirred overnight.

Although preferred embodiments of the invention have been illustrated in the accompanying Drawings and described in the foregoing Detailed Description, it will be understood that the invention is not limited to the embodiments disclosed, but is capable of numerous rearrangements, modifications, and substitutions of parts and elements without departing from the spirit of the invention.

The invention claimed is:

1. A method of manufacturing a high-k film, comprising the steps of:
    providing an organic template;
    synthesizing an oxide film comprising a mesoporous binder phase material in the presence of the organic template;
    thereafter removing the organic template from the oxide film;
    providing a liquid material comprising a liquid precursor for a high-k phase material;
    subsequent to the removal of the organic template, diffusing the precursor for the high-k phase material into the oxide film;
    forming a high-k phase material from the liquid precursor; and
    thereafter hardening the high-k phase material, thus obtaining a high-k film comprising components of the oxide film and the high-k phase material.

2. The method according to claim 1 including the additional step of densifying the mesoporous binder phase material after hardening the high-k phase material.

3. The method according to claim 1 wherein the binder phase material is selected from the group consisting of $SiO_2$, boro-phospho-silicate (BPS) glass, ZnO, $ZnO-SiO_2$, $TiO_2$, $TiO_2/SiO_2$, $Ta_2O_5$, and $Ta_2O_5-TiO_2-SiO_2$.

4. The method according to claim 1 wherein the organic template is a surfactant.

5. The method according to claim 1 wherein the organic template is removed by heating to a temperature between about 350° C. and about 450° C.

6. The method according to claim 1 wherein the organic template is removed by extraction with super critical $CO_2$.

7. The method according to claim 1 wherein the organic template is removed by exposure to UV light followed by heating to a temperature of between about 250° C. and about 300° C.

8. The method according to claim 1 wherein the oxide film is synthesized from a first solution comprising 3.0 g 2-methoxyethanol, 0.55 g titanium isopropoxide, 2.5 g 20% barium isopropoxide in isopropanol, 2.0 g ethanol, and 0.2 g Pluronic P123, and 0.15 g acetylacetone stirred to dissolution; and another solution of 0.10 g ethanol and 0.08 g 1.0 F acetic acid which is added to the first solution.

9. The method according to claim 1 wherein the oxide film is synthesized from a first solution comprising 0.18 acetylacetone, 1.0 g tantalum ethoxide, 1.33 g isopropanol which is allowed to sit overnight (minimum); and a solution of 0.42 g P123, 4.66 g 2-propanol, and 0.05 g $H_2O$, acidified to pH-2 with ethanolic HCl that is added to the first solution the next day and the mix is stirred for an hour.

10. The method according to claim 1 wherein the high-k precursor is diffused into the oxide film's binder phase after removing the organic template; the high-k phase material is formed; and the overall structure is condensed and hardened by annealing at between about 700° C. and about 900° C.

11. The method of claim 4, wherein the surfactant is a polymeric surfactant.

12. The method of claim 11, wherein the polymeric surfactant is a block copolymer of poly(ethylene oxide)-polypropylene oxide).

* * * * *